(12) United States Patent
Chen

(10) Patent No.: US 9,897,848 B2
(45) Date of Patent: Feb. 20, 2018

(54) MANUFACTURING METHOD OF COLOR RESIST LAYER

(71) Applicant: Shenzhen China Star Optoelectronics Technology Co., Ltd., Shenzhen (CN)

(72) Inventor: Lixuan Chen, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 91 days.

(21) Appl. No.: 15/116,223

(22) PCT Filed: Jun. 29, 2016

(86) PCT No.: PCT/CN2016/087613
§ 371 (c)(1),
(2) Date: Aug. 3, 2016

(87) PCT Pub. No.: WO2017/215032
PCT Pub. Date: Dec. 21, 2017

(65) Prior Publication Data
US 2017/0371200 A1 Dec. 28, 2017

(30) Foreign Application Priority Data

Jun. 15, 2016 (CN) .......................... 2016 1 0422372

(51) Int. Cl.
*H01J 9/24* (2006.01)
*G02F 1/1335* (2006.01)
*G03F 1/00* (2012.01)

(52) U.S. Cl.
CPC .......... *G02F 1/133516* (2013.01); *G03F 1/02* (2013.01)

(58) Field of Classification Search
None
See application file for complete search history.

(56) References Cited

U.S. PATENT DOCUMENTS

2005/0244898 A1* 11/2005 Cohen .................... C12N 11/00
                                                        435/7.2
2011/0269364 A1* 11/2011 Yoon ...................... G02B 5/201
                                                         445/24

* cited by examiner

*Primary Examiner* — Nathan T Leong
(74) *Attorney, Agent, or Firm* — Leong C. Lei

(57) ABSTRACT

The invention provides a manufacturing method of color resist layer to manufacture the color resist layer by micro transfer printing (MTP), comprising forming a color resist thin film on a first substrate, using a MTP transfer stamp to adsorb a part of the color resist thin film to the plurality of protrusions of the MTP transfer stamp, and transferring the color resist thin film adsorbed by the plurality of protrusions of the MTP transfer stamp to the second substrate to form the color resist layer on the second substrate. The method uses the protrusions of the MTP transfer stamp to form the pattern to control the pattern of the color resist layer instead of exposure and development. No color resist material is wasted, the cost is reduced and the process is simple and widely applicable.

14 Claims, 7 Drawing Sheets

MANUFACTURING METHOD OF COLOR RESIST LAYER

BACKGROUND OF THE INVENTION

1. Field of the Invention

The present invention relates to the field of display, and in particular to a manufacturing method of color resist layer.

2. The Related Arts

The liquid crystal display (LCD), due to the advantages of high display quality, low power-consumption, thin size, and no radiation, is widely used in mobile phones, TV, PDA, digital camera, notebook PC, desktop PC, and so on.

In general, the LCD panel comprises a color filter (CF) substrate, a thin film transistor (TFT) substrate, an LCD sandwiches between the CF substrate and the TFT substrate, and a sealant; whose manufacturing process comprises an array process (thin film, lithography, etching and stripping), a cell process (attaching TFT substrate and CF substrate), and module assembly process (driver IC and the printed circuit board lamination); wherein the array process is mainly to form TFT substrate, for controlling the LC molecules motion; the cell process is mainly to add LC between the TFT substrate and the CF substrate; and the module assembly process is mainly to laminate the driver IC and integrate the printed circuit board, so as to drive the LC molecules to rotate to generate the images.

The CF substrate is a main part for the LCD. The known manufacturing method for LCD is to manufacture a black matrix (BM) before manufacturing a color resist layer (comprising red color resist, green color resist and blue color resist). The following takes the manufacturing method for res color resist as example to describe the color resist layer manufacturing in known technology: first, coating a red color resist material on the substrate, and then red color resist is cured to become a red color resist thin film, followed by exposure and development processes to form patterned red color resist layer. The drawback is that a large amount of red color resist material is developed and wasted in the above method.

The micro transfer printing is a technology to transfer a micro element grown on a substrate to another substrate by a patterned polydimethylsiloxane (PDMS) transfer stamp to be adsorbed to the micro element off from the substrate, and then the micro element adsorbed by the PDMS transfer stamp is attached to the pre-set position on another substrate, and then the PDMS transfer stamp is lifted off to accomplish micro element transfer.

SUMMARY OF THE INVENTION

The object of the present invention is to provide a manufacturing method of color resist layer, able to reduce the color resist material consumption and the manufacturing cost.

To achieve the above object, the present invention provides a manufacturing method of color resist layer, which comprises: Step 1: providing a first substrate, coating a color resist material on the first substrate, and curing the color resist material to form a color resist thin film; Step 2: providing a micro transfer printing (MTP) transfer stamp, a surface on one side of the MTP transfer stamp having a plurality of protrusions, the plurality of protrusions forming a pattern matching the pattern of a color resist layer to be formed; Step 3: using the MTP transfer stamp to adsorb a part of the color resist thin film to the plurality of protrusions of the MTP transfer stamp; Step 4: providing a second substrate, aligning the MTP transfer stamp and the second substrate, releasing the color resist thin film adsorbed by the plurality of protrusions of the MTP transfer stamp to the second substrate to form the color resist layer on the second substrate.

In Step 1, the color resist material comprises: red color resist material, green color resist material, blue color resist material or white color resist material.

The MTP transfer stamp is a polydimethylsiloxane (PDMS) transfer stamp.

Specifically, Step 3 comprises: attaching the surface on one side of the MTP transfer stamp having a plurality of protrusions to the color resist thin film, and then peeling the MTP transfer stamp off from the color resist thin film so that a part of the color resist thin film is adsorbed to the plurality of protrusions of the MTP transfer stamp.

Specifically, Step 4 comprises: attaching the surface on one side of the MTP transfer stamp having a plurality of protrusions to the second substrate, and then peeling the MTP transfer stamp off from the second substrate so as to form the color resist layer on the second substrate.

The adhesion strength of the MTP transfer stamp on the color resist thin film is proportional to the speed the MTP transfer stamp peels off.

The second substrate is a glass substrate.

The manufacturing method of the color resist layer is applicable to color-filter-on-array (COA) LCD panel, black-matrix-on array (BOA) LCD panel and white organic light-emitting diode (WOLED) LCD panel.

The present invention also provides a manufacturing method of color resist layer, which comprises: Step 1: providing a first substrate, coating a color resist material on the first substrate, and curing the color resist material to form a color resist thin film; Step 2: providing a micro transfer printing (MTP) transfer stamp, a surface on one side of the MTP transfer stamp having a plurality of protrusions, the plurality of protrusions forming a pattern matching the pattern of a color resist layer to be formed; Step 3: using the MTP transfer stamp to adsorb a part of the color resist thin film to the plurality of protrusions of the MTP transfer stamp; Step 4: providing a second substrate, aligning the MTP transfer stamp and the second substrate, releasing the color resist thin film adsorbed by the plurality of protrusions of the MTP transfer stamp to the second substrate to form the color resist layer on the second substrate; wherein specifically, Step 3 comprising: attaching the surface on one side of the MTP transfer stamp having a plurality of protrusions to the color resist thin film, and then peeling the MTP transfer stamp off from the color resist thin film so that a part of the color resist thin film being adsorbed to the plurality of protrusions of the MTP transfer stamp; wherein specifically, Step 4 comprising: attaching the surface on one side of the MTP transfer stamp having a plurality of protrusions to the second substrate, and then peeling the MTP transfer stamp off from the second substrate so as to form the color resist layer on the second substrate.

Compared to the known techniques, the present invention provides the following advantages: the present invention provides a manufacturing method of color resist layer to manufacture the color resist layer by micro transfer printing (MTP), comprising forming a color resist thin film on a first substrate, using a MTP transfer stamp to adsorb a part of the color resist thin film to the plurality of protrusions of the MTP transfer stamp, and transferring the color resist thin film adsorbed by the plurality of protrusions of the MTP transfer stamp to the second substrate to form the color resist layer on the second substrate. The method uses the protrusions of the MTP transfer stamp to form the pattern to control the pattern of the color resist layer instead of exposure and development. No color resist material is wasted, the cost is reduced and the process is simple and widely applicable.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
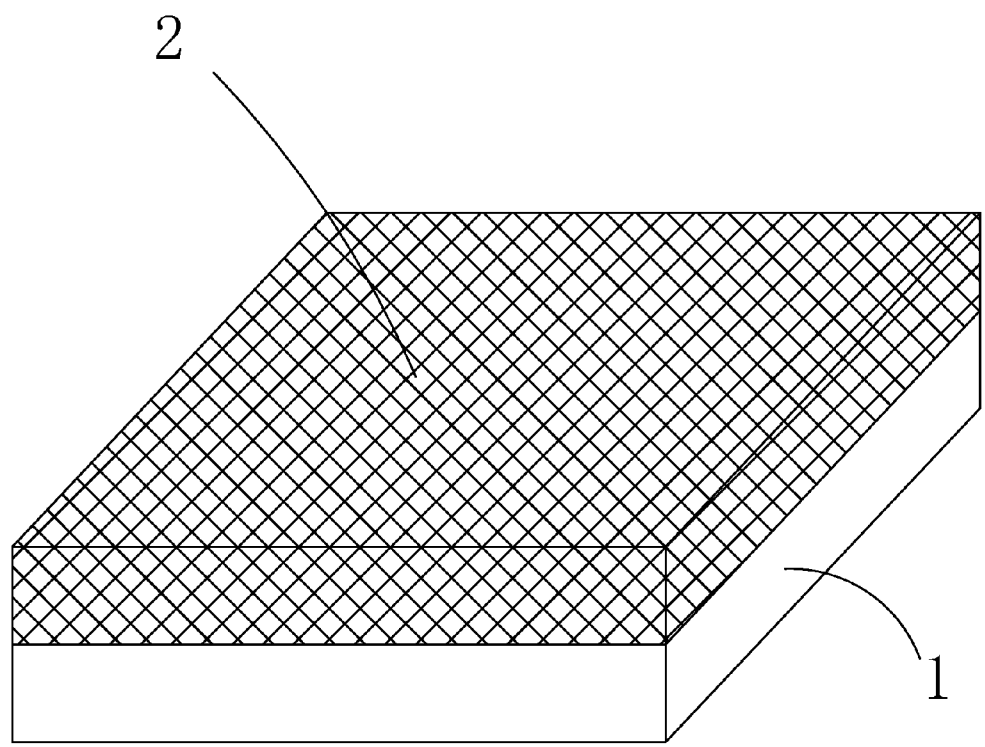
FIG. 1 is a schematic view showing Step 1 of the manufacturing method of color resist layer provided by an embodiment of the present invention.
Figure 7:
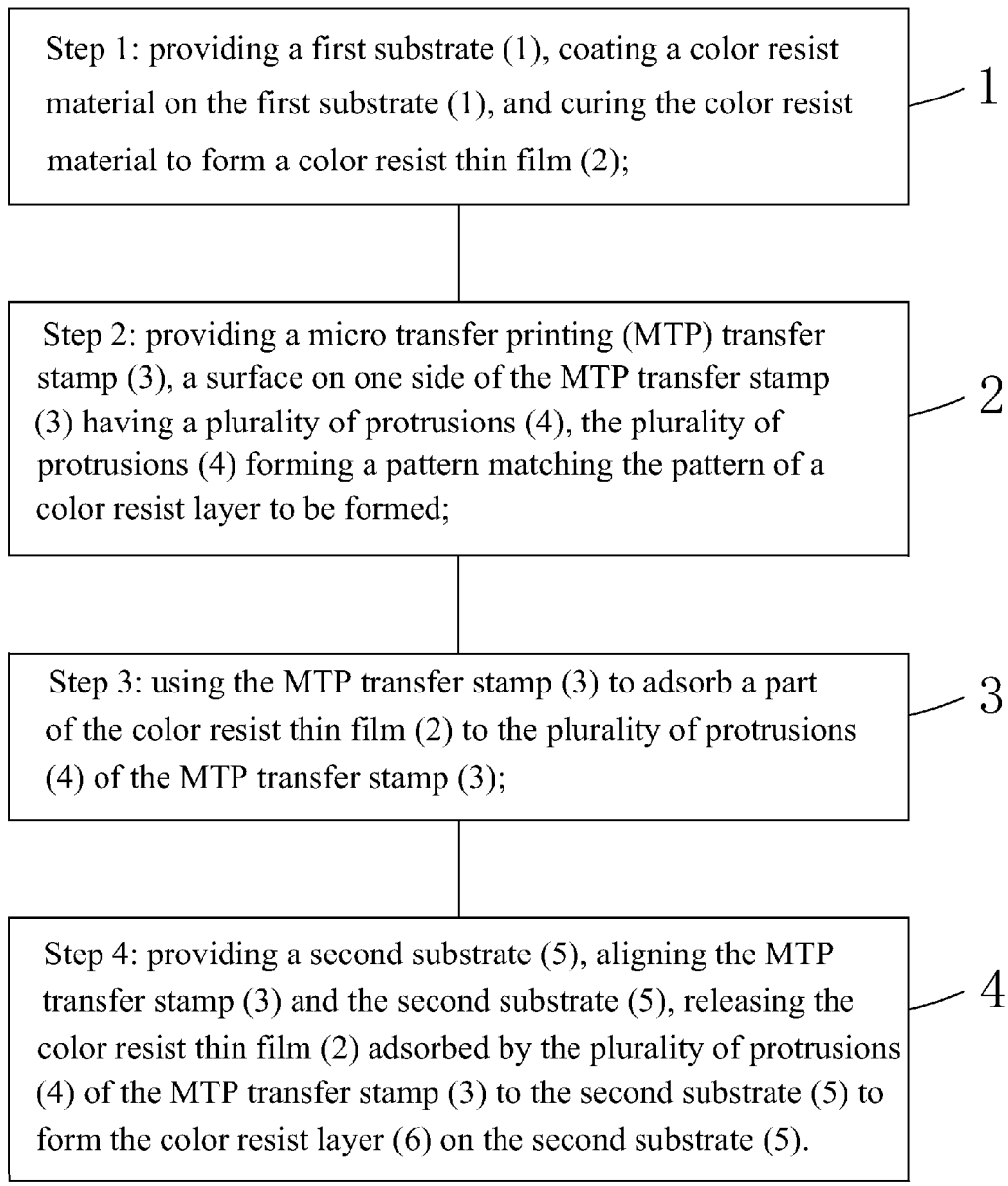
FIG. 7 is a schematic view showing the flowchart of the manufacturing method of color resist layer provided by an embodiment of the present invention.

Refer to FIG. 7. The present invention provides a manufacturing method of color resist layer, which comprises:

Step 1: as shown in FIG. 1, providing a first substrate 1, coating a color resist material on the first substrate 1, and curing the color resist material to form a color resist thin film 2.

Specifically, the color of the color resist material can be any colors required by the application, such as, red color resist material, green color resist material, blue color resist material or white color resist material.

In Step 1, the color resist material is distributed in a solution and the solution with distributed color resist material is coated on the first substrate 1, then a bake process is used to cure the color resist material to form the color resist thin film 2. The color resist thin film 2 has no pattern and covers entirely over the first substrate.

Figure 2:
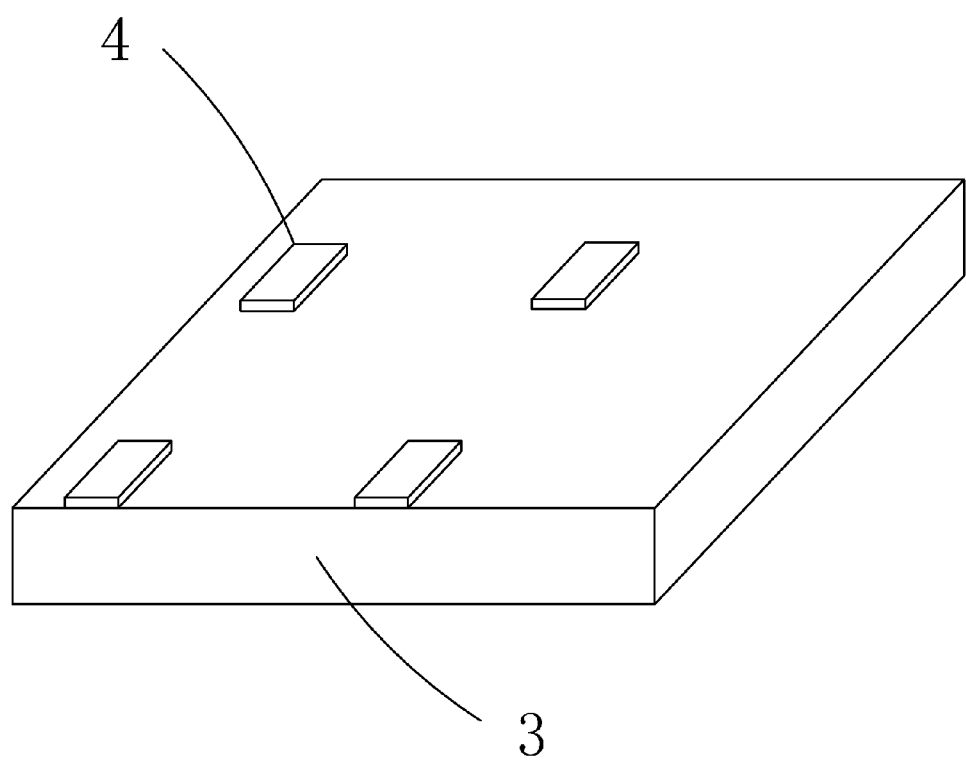
FIG. 2 is a schematic view showing Step 2 of the manufacturing method of color resist layer provided by an embodiment of the present invention.

Step 2: as shown in FIG. 2, providing a micro transfer printing (MTP) transfer stamp 3, a surface on one side of the MTP transfer stamp 3 having a plurality of protrusions 4, the plurality of protrusions 4 forming a pattern matching the pattern of a color resist layer to be formed.

Optionally, the MTP transfer stamp is a polydimethylsiloxane (PDMS) transfer stamp.

Figure 3:
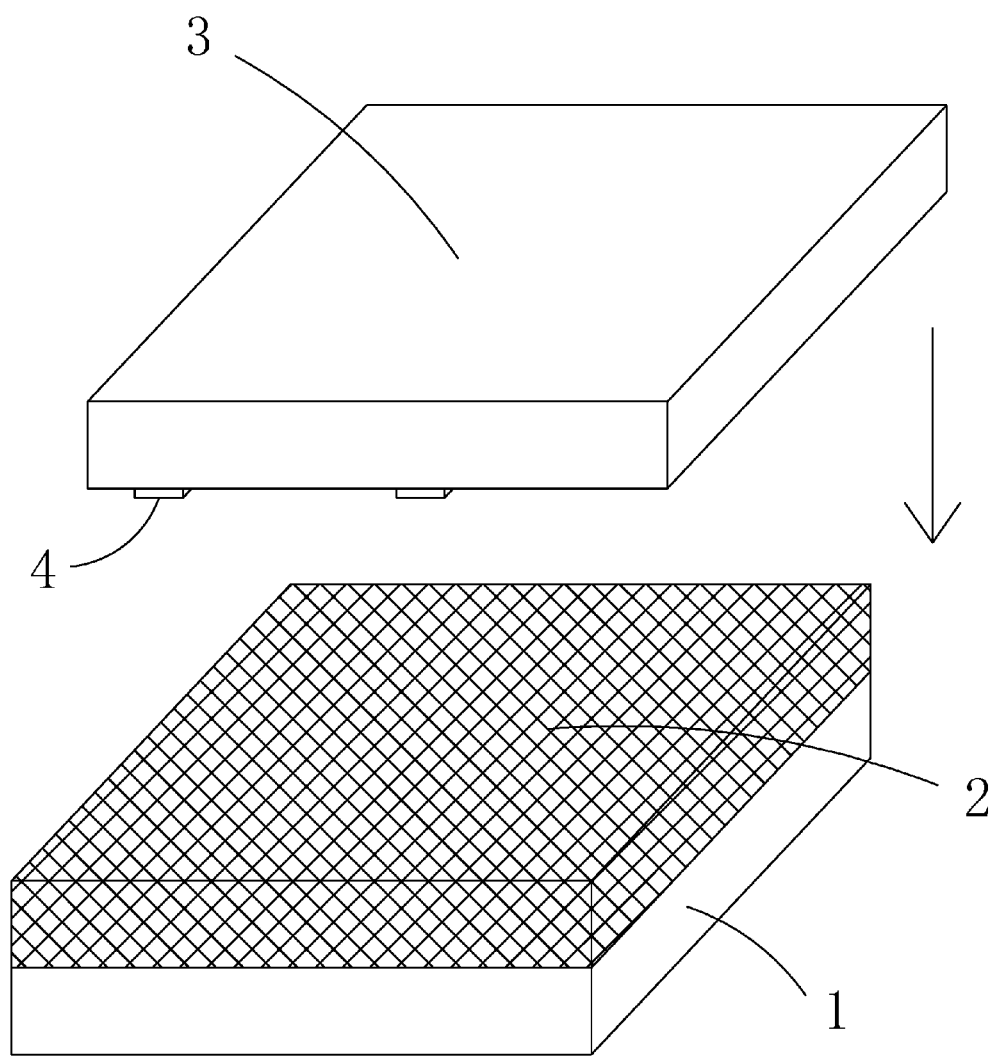
FIG. 3 is a schematic view showing Step 3 of the manufacturing method of color resist layer provided by an embodiment of the present invention.

Step 3: as shown in FIG. 3, using the MTP transfer stamp 3 to adsorb a part of the color resist thin film 2 to the plurality of protrusions 4 of the MTP transfer stamp 3.

Specifically, because the pattern formed by the plurality of protrusions 4 is the same as the pattern of the color resist layer to be formed, the pattern of the such color resist film 4 adsorbed on the plurality of protrusions 4 is also the same as the pattern of the color resist layer to be formed.

Moreover, Step 3 specifically comprises: attaching the surface on one side of the MTP transfer stamp 3 having a plurality of protrusions 4 to the color resist thin film 2, and then peeling the MTP transfer stamp 3 off from the color resist thin film 2 so that a part of the color resist thin film 2 is adsorbed to the plurality of protrusions 4 of the MTP transfer stamp 3.

Figure 6:
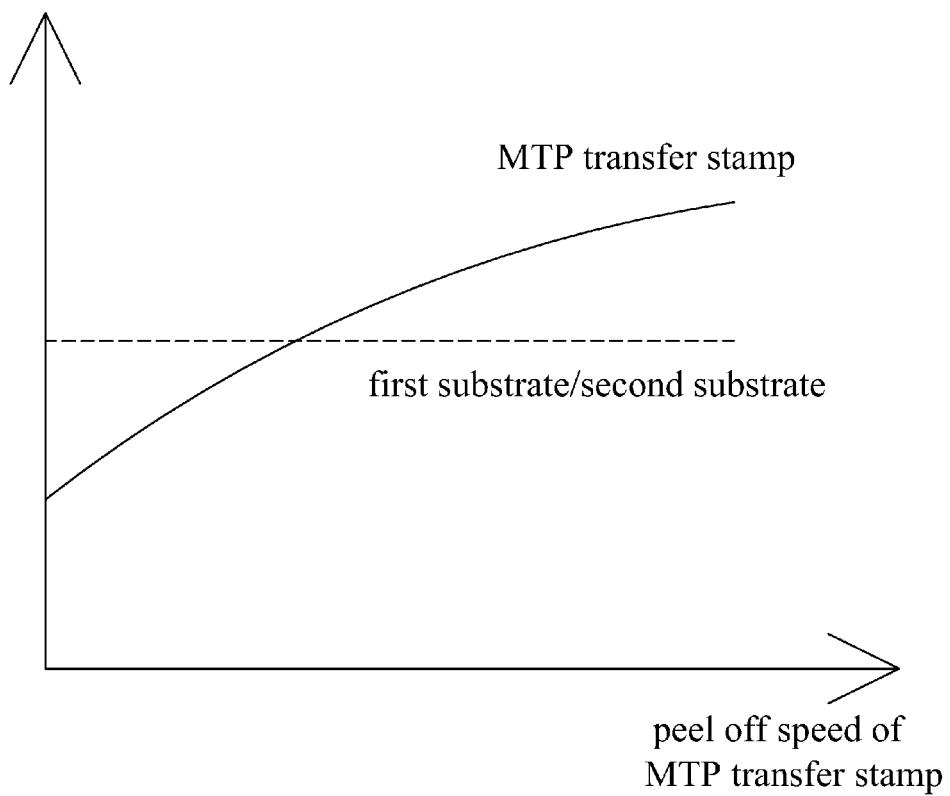
FIG. 6 is a schematic view showing the relation between the speed at which the MTP transfer stamp peels off and the adhesion strength of the MTP transfer stamp on the color resist thin film in the manufacturing method of color resist layer provided by an embodiment of the present invention.

It should be noted that, as shown in FIG. 6, the adhesion strength of the MTP transfer stamp on the color resist thin film is proportional to the speed the MTP transfer stamp peels off.

In other words, the higher the peel off speed of the MTP transfer stamp 3 is from the color resist thin film 2, the larger the adhesion strength of the MTP transfer stamp 3 on the color resist thin film 2. Because the adhesion strength of the first substrate 1 on the color resist film 2 remains constant, the peel off speed of the MTP transfer stamp can be controlled to make the adhesion strength of the MTP transfer stamp 3 on the color resist thin film 2 greater than the adhesion strength of the first substrate 1 on the color resist film 2, resulting in a part of color resist thin film 2 being adsorbed to the plurality of protrusions 4 of the MTP transfer stamp 3.

Figure 4:
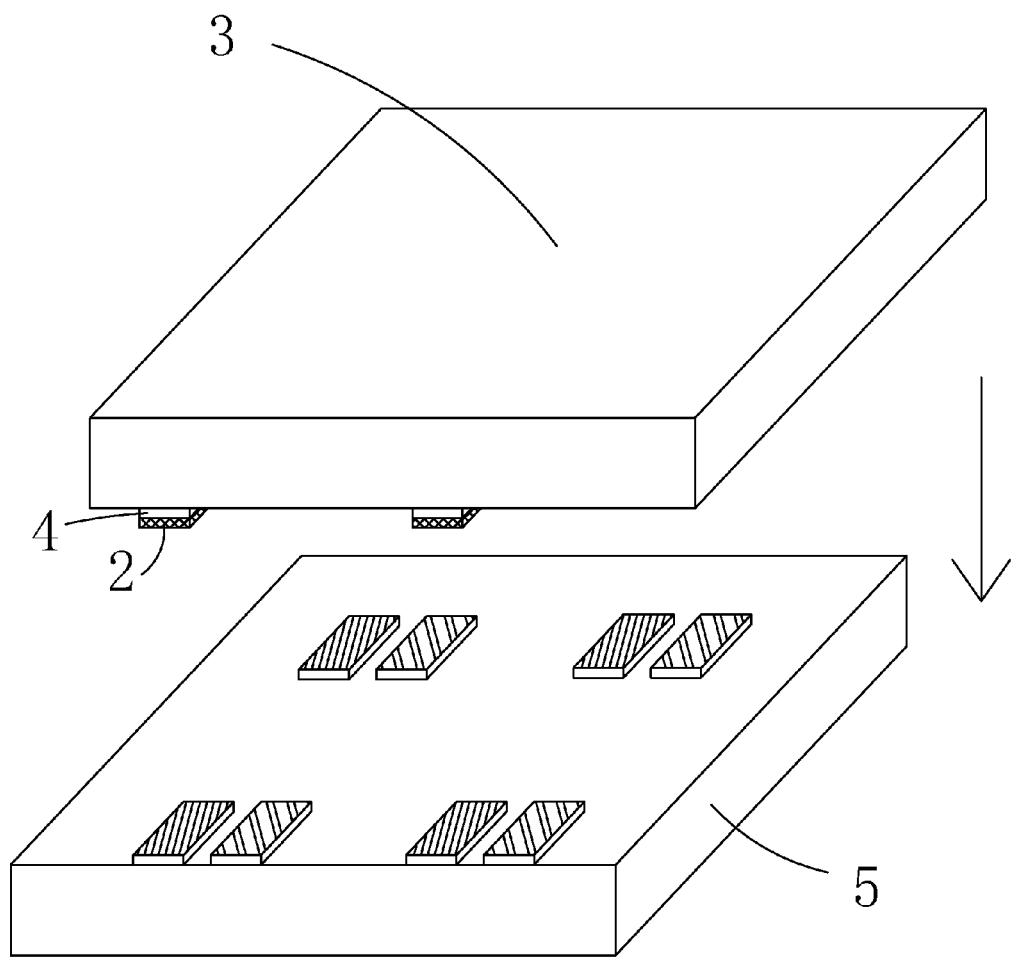
FIG. 4 and FIG. 5 are schematic views showing Step 4 of the manufacturing method of color resist layer provided by an embodiment of the present invention.
Figure 5:
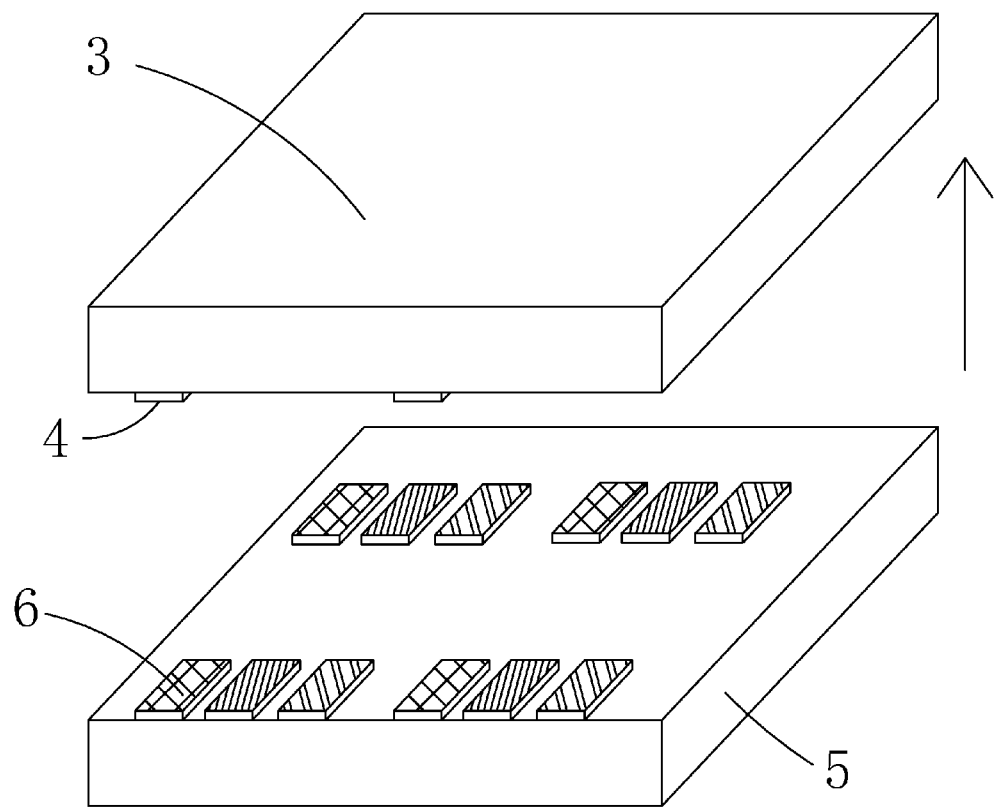

Step 4: as shown in FIG. 4 and FIG. 5, providing a second substrate 5, aligning the MTP transfer stamp 3 and the second substrate 5, releasing the color resist thin film 2 adsorbed by the plurality of protrusions 4 of the MTP transfer stamp 3 to the second substrate 5 to form the color resist layer 6 on the second substrate 5.

Specifically, the second substrate 5 is preferably a glass substrate. Specifically, Step 4 comprises: attaching the surface on one side of the MTP transfer stamp 3 having a plurality of protrusions 4 to the second substrate 5, and then peeling the MTP transfer stamp 3 off from the second substrate 5 so as to form the color resist layer 6 on the second substrate 5.

It should be noted that, as shown in FIG. 6, because the adhesion strength of the second substrate 5 on the color resist film 2 remains constant, the peel off speed of the MTP transfer stamp 3 can be controlled to make the adhesion strength of the MTP transfer stamp 3 on the color resist thin film 2 less than the adhesion strength of the second substrate 5 on the color resist film 2, resulting in a part of color resist thin film 2 adsorbed to the plurality of protrusions 4 of the MTP transfer stamp 3 being transferred to the second substrate 5 to form the color resist layer 6 of a preset pattern at the corresponding location.

It should be noted that the above manufacturing method of the color resist layer is not only applicable to the color resist layer in the color filter of the conventional LCD, but also applicable to color-filter-on-array (COA) LCD panel, black-matrix-on array (BOA) LCD panel and white organic light-emitting diode (WOLED) LCD panel. The color resist layer is not only a color resist layer with sequentially arranged red, green and blue color resists, but also with sequentially arranged red, green, blue and white color resists, or sequentially arranged red, green, blue and yellow color resists. Take the color resist layer with sequentially arranged red, green and blue color resists as example. The above manufacturing method can be repeated a plurality of times to manufacture the red, green and blue color resists in sequence to form corresponding color resist layer.

In summary, the present invention provides a manufacturing method of color resist layer to manufacture the color resist layer by micro transfer printing (MTP), comprising forming a color resist thin film on a first substrate, using a MTP transfer stamp to adsorb a part of the color resist thin film to the plurality of protrusions of the MTP transfer stamp, and transferring the color resist thin film adsorbed by the plurality of protrusions of the MTP transfer stamp to the second substrate to form the color resist layer on the second substrate. The method uses the protrusions of the MTP transfer stamp to form the pattern to control the pattern of the color resist layer instead of exposure and development. No color resist material is wasted, the cost is reduced and the process is simple and widely applicable.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A manufacturing method of color resist layer, which comprises:
   Step 1: providing a first substrate, coating a color resist material on the first substrate, and curing the color resist material to form a color resist thin film;
   Step 2: providing a micro transfer printing (MTP) transfer stamp, a surface on one side of the MTP transfer stamp having a plurality of protrusions, the plurality of protrusions forming a pattern matching the pattern of a color resist layer to be formed;
   Step 3: using the MTP transfer stamp to adsorb a part of the color resist thin film to the plurality of protrusions of the MTP transfer stamp; and
   Step 4: providing a second substrate, aligning the MTP transfer stamp and the second substrate, releasing the color resist thin film adsorbed by the plurality of protrusions of the MTP transfer stamp to the second substrate to form the color resist layer on the second substrate.

2. The manufacturing method of color resist layer as claimed in claim 1, wherein in Step 1, the color resist material comprises: red color resist material, green color resist material, blue color resist material or white color resist material.

3. The manufacturing method of color resist layer as claimed in claim 1, wherein the MTP transfer stamp is a polydimethylsiloxane (PDMS) transfer stamp.

4. The manufacturing method of color resist layer as claimed in claim 1, wherein Step 3 specifically comprises: attaching the surface on one side of the MTP transfer stamp having a plurality of protrusions to the color resist thin film, and then peeling the MTP transfer stamp off from the color resist thin film so that a part of the color resist thin film is adsorbed to the plurality of protrusions of the MTP transfer stamp.

5. The manufacturing method of color resist layer as claimed in claim 4, wherein the adhesion strength of the MTP transfer stamp on the color resist thin film is proportional to the speed the MTP transfer stamp peels off.

6. The manufacturing method of color resist layer as claimed in claim 1, wherein Step 4 specifically comprises: attaching the surface on one side of the MTP transfer stamp having a plurality of protrusions to the second substrate, and then peeling the MTP transfer stamp off from the second substrate so as to form the color resist layer on the second substrate.

7. The manufacturing method of color resist layer as claimed in claim 1, wherein the second substrate is a glass substrate.

8. The manufacturing method of color resist layer as claimed in claim 1, wherein the manufacturing method of the color resist layer is applicable to color-filter-on-array (COA) LCD panel, black-matrix-on array (BOA) LCD panel and white organic light-emitting diode (WOLED) LCD panel.

9. A manufacturing method of color resist layer, which comprises:
   Step 1: providing a first substrate, coating a color resist material on the first substrate, and curing the color resist material to form a color resist thin film;
   Step 2: providing a micro transfer printing (MTP) transfer stamp, a surface on one side of the MTP transfer stamp having a plurality of protrusions, the plurality of protrusions forming a pattern matching the pattern of a color resist layer to be formed;
   Step 3: using the MTP transfer stamp to adsorb a part of the color resist thin film to the plurality of protrusions of the MTP transfer stamp; and
   Step 4: providing a second substrate, aligning the MTP transfer stamp and the second substrate, releasing the color resist thin film adsorbed by the plurality of protrusions of the MTP transfer stamp to the second substrate to form the color resist layer on the second substrate;
   wherein Step 3 specifically comprising: attaching the surface on one side of the MTP transfer stamp having a plurality of protrusions to the color resist thin film, and then peeling the MTP transfer stamp off from the color resist thin film so that a part of the color resist thin film being adsorbed to the plurality of protrusions of the MTP transfer stamp;
   Step 4 specifically comprising: attaching the surface on one side of the MTP transfer stamp having a plurality of protrusions to the second substrate, and then peeling the MTP transfer stamp off from the second substrate so as to form the color resist layer on the second substrate.

10. The manufacturing method of color resist layer as claimed in claim 9, wherein in Step 1, the color resist material comprises: red color resist material, green color resist material, blue color resist material or white color resist material.

11. The manufacturing method of color resist layer as claimed in claim 9, wherein the MTP transfer stamp is a polydimethylsiloxane (PDMS) transfer stamp.

12. The manufacturing method of color resist layer as claimed in claim 9, wherein the adhesion strength of the MTP transfer stamp on the color resist thin film is proportional to the speed the MTP transfer stamp peels off.

13. The manufacturing method of color resist layer as claimed in claim 9, wherein the second substrate is a glass substrate.

14. The manufacturing method of color resist layer as claimed in claim 9, wherein the manufacturing method of the color resist layer is applicable to color-filter-on-array (COA) LCD panel, black-matrix-on array (BOA) LCD panel and white organic light-emitting diode (WOLED) LCD panel.

* * * * *